(12) United States Patent
Lin et al.

(10) Patent No.: US 12,074,116 B2
(45) Date of Patent: Aug. 27, 2024

(54) INTEGRATED PACKAGE STRUCTURE

(71) Applicant: JCET GROUP CO., LTD., Wuxi (CN)

(72) Inventors: Yaojian Lin, Wuxi (CN); Haitao Shi, Wuxi (CN); Xueqing Chen, Wuxi (CN); Jian Chen, Wuxi (CN); Shasha Zhou, Wuxi (CN); Shuo Liu, Wuxi (CN)

(73) Assignee: JCET GROUP CO., LTD., Wuxi (CN)

( * ) Notice: Subject to any disclaimer, the term of this patent is extended or adjusted under 35 U.S.C. 154(b) by 356 days.

(21) Appl. No.: 17/613,057

(22) PCT Filed: May 25, 2020

(86) PCT No.: PCT/CN2020/092034
§ 371 (c)(1),
(2) Date: Nov. 20, 2021

(87) PCT Pub. No.: WO2021/057055
PCT Pub. Date: Apr. 1, 2021

(65) Prior Publication Data
US 2022/0223541 A1 Jul. 14, 2022

(30) Foreign Application Priority Data
Sep. 25, 2019 (CN) .......................... 201910909470.2

(51) Int. Cl.
*H01L 23/52* (2006.01)
*H01L 23/31* (2006.01)
(Continued)

(52) U.S. Cl.
CPC ........ *H01L 23/552* (2013.01); *H01L 23/3107* (2013.01); *H01L 23/49822* (2013.01); *H01L 25/18* (2013.01); *H01L 23/49816* (2013.01)

(58) Field of Classification Search
CPC ...................... H01L 23/3107; H01L 23/49822
See application file for complete search history.

(56) References Cited

U.S. PATENT DOCUMENTS

| 10,535,608 B1* | 1/2020 | Rubin ..................... H01L 24/73 |
| 11,342,305 B2* | 5/2022 | Elsherbini ............... H01L 25/50 |

(Continued)

FOREIGN PATENT DOCUMENTS

| CN | 102044530 A | 5/2011 |
| CN | 104051450 A | 9/2014 |

(Continued)

*Primary Examiner* — Nicholas J Tobergte
(74) *Attorney, Agent, or Firm* — Cheng-Ju Chiang

(57) ABSTRACT

The present invention relates to an integrated package structure. The integrated package structure includes a main substrate, a first module, a second module, a cavity element and a large-size device, wherein the main substrate includes a first surface of the main substrate and a second surface of the main substrate opposite to each other; the first module and the second module are stacked; the first module and the second module which are stacked, the cavity element and the large-size device are horizontally arranged on the first surface of the main substrate, and are respectively electrically connected to the main substrate. Owing to this arrangement, the demand of a current integrated package structure for a further high-density, miniaturized, multi-dimensional and multi-demand layout design can be met.

14 Claims, 4 Drawing Sheets

(51) Int. Cl.
    *H01L 23/498*     (2006.01)
    *H01L 23/552*     (2006.01)
    *H01L 25/18*     (2023.01)

(56) References Cited

U.S. PATENT DOCUMENTS

| | | | |
|---|---|---|---|
| 11,557,579 B2* | 1/2023 | Zhang | H01L 21/568 |
| 11,610,847 B2* | 3/2023 | Kim | H01L 25/16 |
| 11,862,572 B2* | 1/2024 | Kim | H01L 21/56 |
| 2014/0185264 A1* | 7/2014 | Chen | H01L 23/3128 |
| | | | 361/814 |
| 2017/0254968 A1* | 9/2017 | Ding | H01L 24/20 |
| 2018/0286780 A1 | 10/2018 | Qi et al. | |
| 2019/0244947 A1* | 8/2019 | Yu | H01L 24/92 |
| 2019/0287947 A1 | 9/2019 | Chen et al. | |
| 2020/0185367 A1* | 6/2020 | Bhagavat | H01L 25/16 |

FOREIGN PATENT DOCUMENTS

| | | |
|---|---|---|
| CN | 107749411 A | 3/2018 |
| CN | 109314101 A | 2/2019 |
| CN | 110071073 A | 7/2019 |

\* cited by examiner

INTEGRATED PACKAGE STRUCTURE

CROSS-REFERENCE TO RELATED APPLICATION

The present application claims priority to the Chinese patent application No. 201910909470.2, filed on Sep. 25, 2019 and entitled "INTEGRATED PACKAGE STRUCTURE", the entire content of which is incorporated herein by reference.

TECHNICAL FIELD

The present invention relates to the field of package technologies, and in particular relates to an integrated package structure.

BACKGROUND

With the development of semiconductor technologies, particularly the arrival of the 5G communication era, not only are electronic devices required to be more and more miniaturized and thinner, but also there is a growing demand for heterogeneous integration of different elements. Therefore, heterogeneous integrated package of semiconductors has gradually become a trend of package.

In order to meet multi-frequency and multi-bandwidth applications, a heterogeneous integrated package structure is required to have high-density, be miniaturized and multi-dimensional. In the package structure, there are large-size package devices with high heights, such as large-value inductor devices, QFN, LGA or BGA, and there are also cavity elements such as a stress-sensitive filter. In addition, module components containing various chips are generally larger in area and volume, and thus, it is necessary to arrange the integrated package structure reasonably so as to meet the requirements of various devices and improve the overall integration level.

SUMMARY

An objective of the present invention is to provide an integrated package structure, so as to meet the demand of a current integrated package structure for a further high-density, miniaturized, multi-dimensional and multi-demand layout design.

In order to fulfill one of the above objectives, an embodiment of the present invention provides an integrated package structure, including a main substrate, a first module, a second module, a cavity element and a large-size device, wherein the main substrate includes a first surface of the main substrate and a second surface of the main substrate opposite to each other; the first module and the second module are stacked; the first module and the second module which are stacked, the cavity element, and the large-size device are horizontally arranged on the first surface of the main substrate, and are respectively electrically connected to the main substrate.

As an improvement of an embodiment of the present invention, the integrated package structure further includes a plastic package layer covering the first surface of the main substrate and encapsulating the first module, the second module, the cavity element and the large-size device, wherein the plastic package layer includes a first surface of the plastic package layer distal from the main substrate and a second surface of the plastic package layer proximal to the main substrate; and the first surface of the plastic package layer is provided with an opening groove extending towards the cavity element and at least partially facing the cavity element.

As a further improvement of an embodiment of the present invention, the opening groove is an inverted trapezoidal opening groove symmetrically distributed along the central axis of the cavity element.

As a further improvement of an embodiment of the present invention, the opening groove is a stepped opening groove located at a convex corner of the plastic package layer.

As a further improvement of an embodiment of the present invention, the integrated package structure further includes a first shielding layer and a second shielding layer, wherein the first shielding layer covers the first module, and the second shielding layer covers the first module, the second module, the cavity element, the large-size device and the main substrate; and the first shielding layer and the second shielding layer are different in material, or in structure, or in material and structure.

As a further improvement of an embodiment of the present invention, the integrated package structure further includes a hollow interposer, wherein the interposer is stacked between the first module and the main substrate, and electrically connects the first module to the main substrate; and the second module is located at the hollow portion of the interposer.

As a further improvement of an embodiment of the present invention, one end of the interposer is electrically connected to the first shielding layer, and the other end of the interposer is electrically connected to a ground terminal of the main substrate.

As a further improvement of an embodiment of the present invention, the interposer is an organic substrate interposer, or an encapsulation interposer, or a redistributed heterogeneous laminated interposer.

As a further improvement of an embodiment of the present invention, the integrated package structure further includes a third module disposed on the second surface of the main substrate, wherein the third module at least partially faces the second module.

As a further improvement of an embodiment of the present invention, the second module is an SOC chip, the third module is a memory module, and the integrated package structure further includes a third shielding layer covering the SOC chip and a fourth shielding layer covering the memory module.

As a further improvement of an embodiment of the present invention, the main substrate is an organic substrate, or a homogeneous or heterogeneous laminate of a wafer and a board-level redistribution layer using film coating or gluing.

Compared with the prior art, the present invention has the following beneficial effects: on the main substrate of the integrated package structure, module components are stacked, and then the stacked module components, the large-size device, the cavity element and the like are horizontally arranged, such that the integrated package structure is further miniaturized and concentrated by an overall reasonable layout, and the requirements for packaging various package devices can be met.

DETAILED DESCRIPTION

Figure 1:
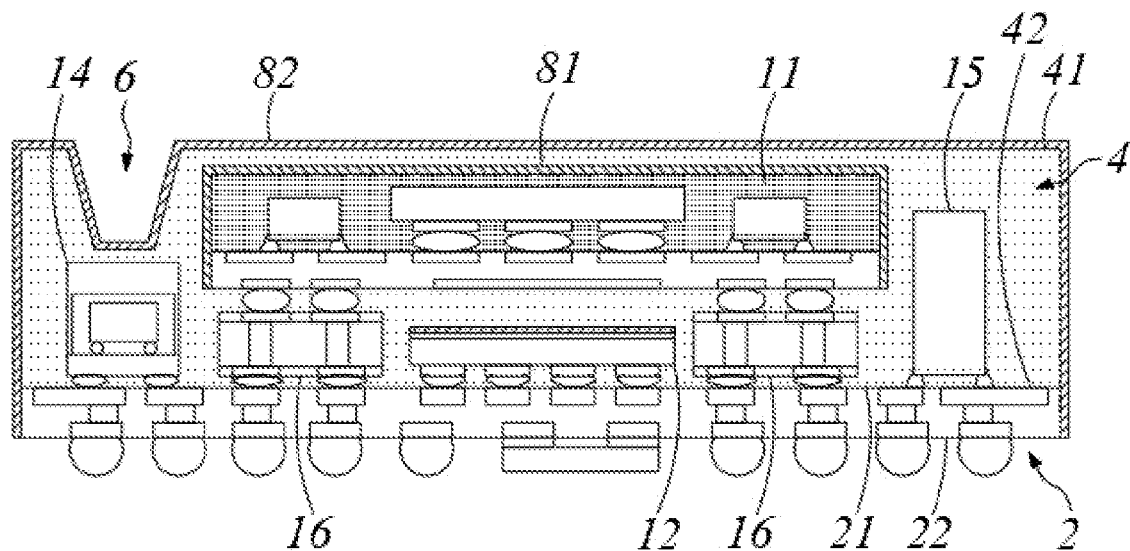
FIG. 1 is a schematic diagram of an integrated package structure according to Embodiment 1 of the present invention.
Figure 2:
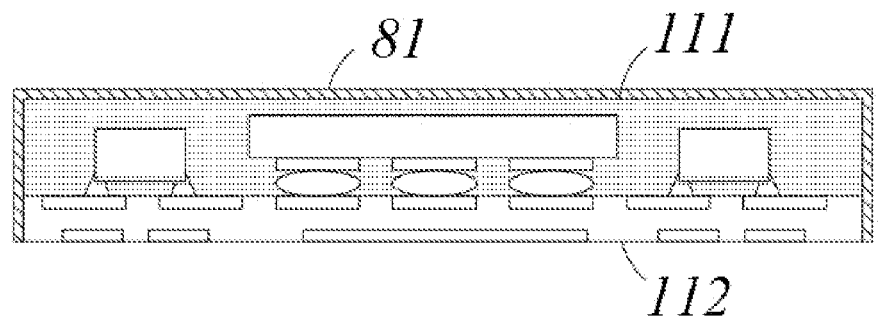
FIG. 2 is a schematic structural diagram of a first module and a first shielding layer according to Embodiment 1 of the present invention.
Figure 3:
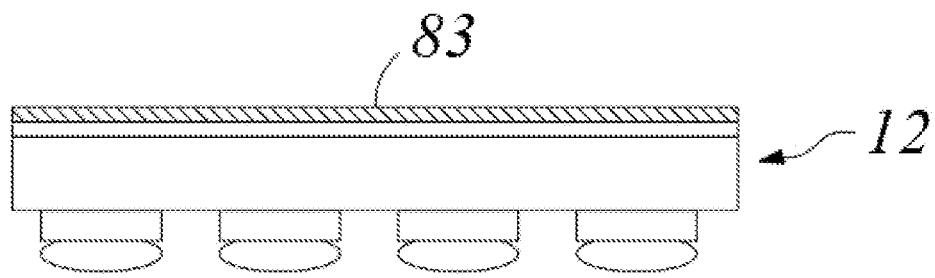
FIG. 3 is a schematic structural diagram of a second module and a third shielding layer according to Embodiment 1 of the present invention.
Figure 4:
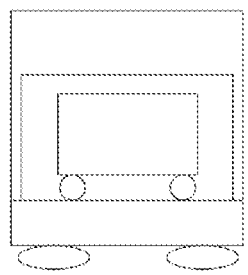
FIG. 4 is a schematic structural diagram of a cavity element according to Embodiment 1 of the present invention.
Figure 5:
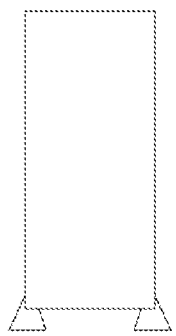
FIG. 5 is a schematic structural diagram of a large-size device according to Embodiment 1 of the present invention.
Figure 6:
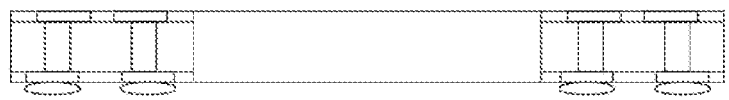
FIG. 6 is a schematic structural diagram of an interposer according to Embodiment 1 of the present invention.

In order to make the purpose, technical solutions, and advantages of the present application clearer, the technical solutions of the present application will be clearly and completely described below in conjunction with the specific embodiments of the present application and the corresponding drawings. Obviously, the described embodiments are only a part of the embodiments of the present application, rather than all of the embodiments. Based on the embodiments in this application, all other embodiments obtained by those of ordinary skill in the art without creative work shall fall within the protection scope of this application.

The following describes the embodiments of the present invention in detail. Examples of the embodiments are shown in the accompanying drawings, in which the same or similar reference numerals indicate the same or similar elements or elements with the same or similar functions through the whole text. The following embodiments described with reference to the accompanying drawings are exemplary, and are only used to explain the present invention, but should not be understood as limiting the same.

A device may be otherwise oriented (rotated by 90° or at other orientations), and the spatially relative descriptors used herein interpreted accordingly. As in the present invention, for the ease of description, in a package structure, the side of a substrate proximal to a chip is the front side of the substrate, and the side of the substrate distal from the chip is the back side of the substrate; and the direction of a plane where the substrate is located is the horizontal direction, and the thickness direction of the substrate is the vertical direction or perpendicular direction.

As shown in FIGS. 1 to 6, an embodiment of the present invention provides an integrated package structure, including a main substrate 2, a first module 11, a second module 12, a cavity element 14 and a large-size device 15. The main substrate 2 includes a first surface 21 of the main substrate and a second surface 22 of the main substrate opposite to each other; the first module 11 and the second module 12 are stacked; and the first module 11 and the second module 12 which are stacked, the cavity element 14 and the large-size device 15 are horizontally arranged on the first surface 21 of the main substrate, and are respectively electrically connected to the main substrate 2.

Specifically, in the integrated package structure, the main substrate 2 includes the first surface 21 of the main substrate and the second surface 22 of the main substrate opposite to each other. The first surface 21 of the main substrate mainly allows various package elements to be arranged thereon, and the second surface 22 of the main substrate opposite to the first surface 21 is mainly configured to be connected to a PCB and other devices below the integrated package structure. On the first surface 21 of the main substrate, the first module 11 and the second module 12 are stacked to form a stacked module combination. The cavity element 14, the large-size device 15 and the stacked module combination are horizontally arranged, and are respectively electrically connected to the main substrate 2. Therefore, by stacking at least once, occupied areas and space of two or more modules in the integrated package structure can be reduced. Meanwhile, the higher large-size device 15, the stress-sensitive cavity element 14 and the stacked module combination are horizontally arranged, which can reasonably reduce the overall height of the combined package elements in the integrated package structure, such that the integrated package structure is more compact in overall space and more integrated in internal structure.

Optionally, the first module 11 and the second module 12 may be stacked in unlimited ways. That is, the first module 11 is disposed on the first surface 21 of the main substrate and the second module 12 is stacked above the first module 11; or, the second module 12 is disposed on the first surface 21 of the main substrate, and the first module 11 is stacked above the second module 12. Meanwhile, the cavity element 14, the large-size device 15 and the stacked module combination are horizontally arranged in unlimited ways. That is, the cavity element 14 and the large-size device 15 are horizontally arranged at two sides of the stacked module combination respectively or are both disposed at the same side of the stacked module combination.

Optionally, the large-size device 15 may be one or more of higher large-size package devices, such as a large-value inductor device, QFN, LGA or BGA, but is not specifically limited thereto. The cavity element 14 may be a package device, such as a filter.

Further, the integrated package structure further includes a plastic package layer 4 covering the first surface 21 of the main substrate and encapsulating the first module 11, the second module 12, the cavity element 14 and the large-size device 15. The plastic package layer 4 includes a first surface 41 of the plastic package layer distal from the main substrate 2 and a second surface 42 of the plastic package layer proximal to the main substrate 2. The first surface 41 of the plastic package layer is provided with an opening groove 6 extending towards the cavity element 14 and at least partially facing the cavity element 14.

Further, the opening groove 6 is an inverted trapezoidal opening groove 6 symmetrically distributed along the central axis of the cavity element 14.

Specifically, the plastic package layer 4 covers the first surface 21 of the main substrate, and meanwhile, encapsulates all the package elements on the first surface 21 of the main substrate, including the first module 11, the second module 12, the cavity element 14 and the large-size device 15. The upper surface of the plastic package layer 4 distal from the main substrate 2 is the first surface 41 of the plastic package layer, while the lower surface of the plastic package layer 4 proximal to the main substrate 2 is the second surface 42 of the plastic package layer.

The cavity of the cavity element 14 is generally disposed upwards. In order to prevent the plastic package layer 4 from causing severe stress damage to the cavity element 14 under the action of thermal expansion and contraction, the opening groove 6 is formed in the first surface 41 of the plastic package layer corresponding to the cavity element 14, and at least part of the opening groove 6 is disposed right above the cavity element 14, such that the plastic package layer 4 above the cavity element 14 is hollowed out. Thus, the stress effect of the plastic package layer 4 on the cavity in the cavity element 14 under the action of thermal expansion and contraction is reduced and the cavity element 14 is prevented from being damaged by undesirable stress.

In this embodiment, the opening groove 6 is completely located above the cavity element 14 and corresponds to the cavity. That is, the opening groove 6 is symmetrically distributed along the central axis of the cavity element 14, such that the stress effect applied to the cavity element 14 can be uniformly reduced and an optimal stress relief effect is achieved. Meanwhile, the opening groove 6 takes the shape of an inverted trapezoid, and after the plastic package layer 4 is molded, the inverted trapezoidal opening groove 6 enables a demoulding process to be fast and convenient.

Optionally, the opening groove 6 is unlimited in shape as long as the opening groove is designed to facilitate demoulding, and may also be formed by laser grooving after the plastic package layer 4 is formed. Alternatively, the opening groove 6 may be arranged in the form of a porous array.

Further, the opening groove 6 is a stepped opening groove 6 located at the convex corner of the plastic package layer 4.

Specifically, the convex corner of the plastic package layer 4 may also be cut to form the stepped opening groove 6. A step surface of the stepped opening groove 6 is unlimited in height, and the stepped opening groove 6 may be located above the cavity element 14, such that the step surface is higher than a primary package surface in the cavity element 14. The stepped opening groove 6 may also be arranged outside the cavity element 14 by way of yielding, such that the step surface is lower than the primary package surface in the cavity element 14.

Further, the integrated package structure further includes a first shielding layer 81 and a second shielding layer 82. The first shielding layer 81 covers the first module 11, and the second shielding layer 82 covers the first module 11, the second module 12, the cavity element 14, the large-size device 15 and the main substrate 2. The first shielding layer 81 and the second shielding layer 82 are different in material, or in structure, or in material and structure.

Further, the integrated package structure further includes a hollow interposer 16. The interposer 16 is stacked between the first module 11 and the main substrate 2, and electrically connects the first module 11 to the main substrate 2, and the second module 12 is located at the hollow portion of the interposer 16.

Specifically, the first shielding layer 81 is disposed at the periphery of the first module 11 and covers the first module 11 to prevent the first module 11 from being disturbed. The second shielding layer 82 is disposed at the periphery of the whole integrated package structure and covers all the package elements on the main substrate 2. Meanwhile, the second shielding layer 82 is electrically connected to a ground terminal of the main substrate 2, so as to electromagnetically shield and protect the package devices on the main substrate 2. According to the specific multi-frequency application, the shielding layer is unlimited in structure, and may be of a single metal layer, multiple metal layers, a conductive adhesive, a metal cover, or the like. Materials of the two shielding layers are not limited, and may be one or more combinations of aluminum, copper, chromium, tin, gold, silver, nickel or stainless steel. The first shielding layer 81 and the second shielding layer 82 are unlimited in structure type and material type. That is, they may be different in material, or in structure or in material and structure, so as to achieve the best EMI shielding effect and the optimal cost.

Figure 7:
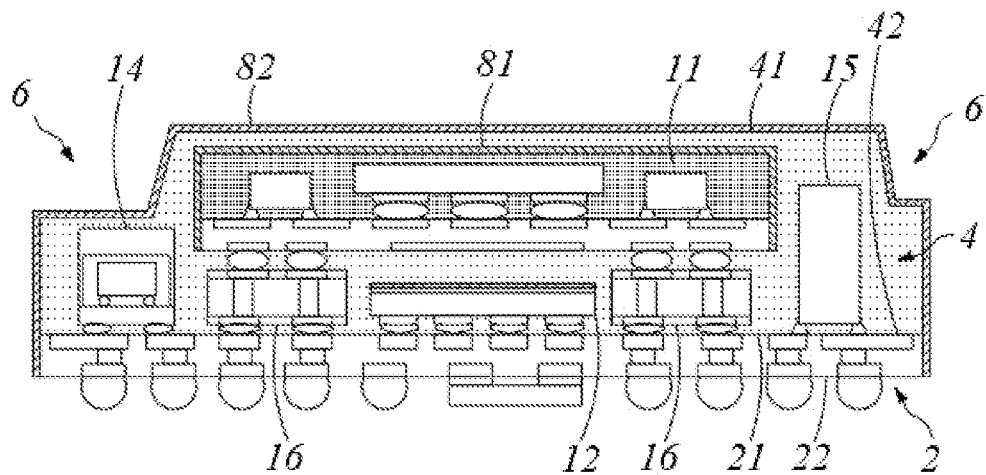
FIG. 7 is a schematic diagram of an integrated package structure according to Embodiment 2 of the present invention.

As shown in FIG. 7, the integrated package structure further includes the interposer 16 of a hollow structure. The first module 11 and the interposer 16 are stacked on the main substrate 2, and the second module 12 is arranged at the hollow portion of the interposer 16, i.e., on the first surface 21 of the main substrate. The interposer 16 is nested with the second module 12, and the first module 11 is stacked on the nested structure. Meanwhile, the interposer 16 is provided with a conductive structure, and thus may electrically connect the first module 11 to the main substrate 2.

Therefore, the interposer 16 of the hollow structure may not only be nested with the second module 12 and support the first module 11, but also electrically connect the first module 11 to the main substrate 2, and is wholly arranged on the first surface 21 of the main substrate, such that the package structure is integrated compactly and has complete electrical functions.

Optionally, the interposer 16 is unlimited in form, and may be a frame interposer, a U-shaped interposer or an I-shaped interposer. When the interposer 16 is the I-shaped interposer, the number of the interposers 16 is unlimited and may be two or more.

Further, one end of the interposer 16 is electrically connected to the first shielding layer 81 and the other end of the interposer 16 is electrically connected to the ground terminal of the main substrate 2.

Specifically, the interposer 16 may also be part of an EMI shielding and protecting functional structure. When the interposer 16 is stacked on the first module 11 and electrically connects the first module 11 to the main substrate 2, the interposer 16 may be electrically connected to the first shielding layer 81, while the interposer 16 is electrically connected to the ground terminal of the main substrate 2. Therefore, the first shielding layer 81 may be electrically connected to the ground terminal of the main substrate 2, such that the first shielding layer 81 can effectively perform EMI shielding on the first module 11, thereby playing a protective role.

Further, the interposer 16 is an organic substrate interposer or an encapsulation interposer or a redistributed heterogeneous laminated interposer.

Specifically, the interposer 16 is unlimited in type and may be one of the above three types. An encapsulating material used by the encapsulation interposer may be an epoxy resin or phenolic resin-based composite material containing a filler.

Optionally, when the number of the interposers 16 is two or more, the types of the interposers 16 may be one or more or a combination of the above three types.

Optionally, a three-dimensional interposing structure in the interposer may be designed according to actual situations, and may be I-shaped or T-shaped. The interposer may be designed with only electrical interposing distribution or embedded devices.

Further, the integrated package structure further includes a third module 13 disposed on the second surface 22 of the main substrate, and the third module 13 at least partially faces the second module 12.

Further, the second module 12 is an SOC chip, and the third module 13 is a memory module. The integrated package structure further includes a third shielding layer 83 covering the SOC chip and a fourth shielding layer 84 covering the memory module.

Figure 8:
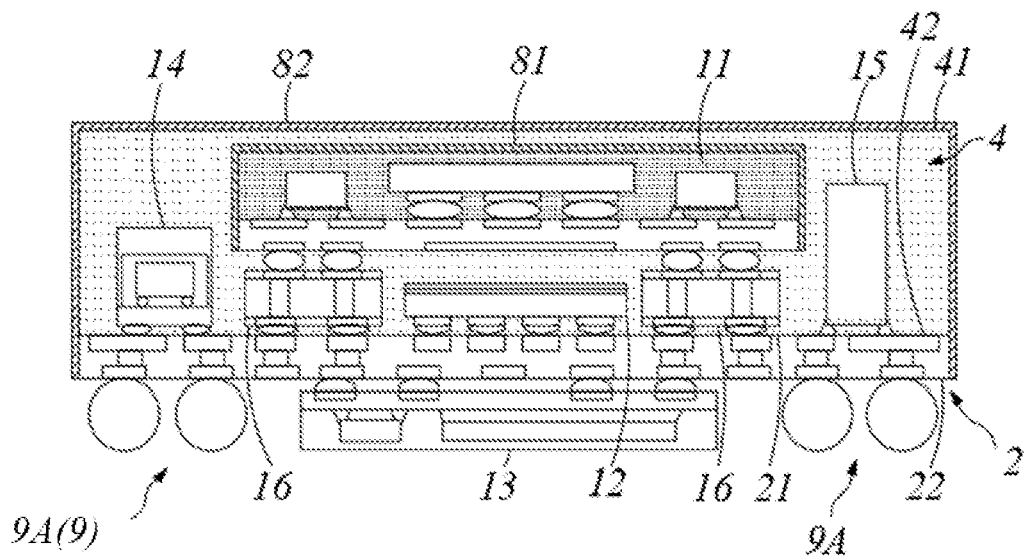
FIG. 8 is a schematic diagram of an integrated package structure according to Embodiment 3 of the present invention.
Figure 9:
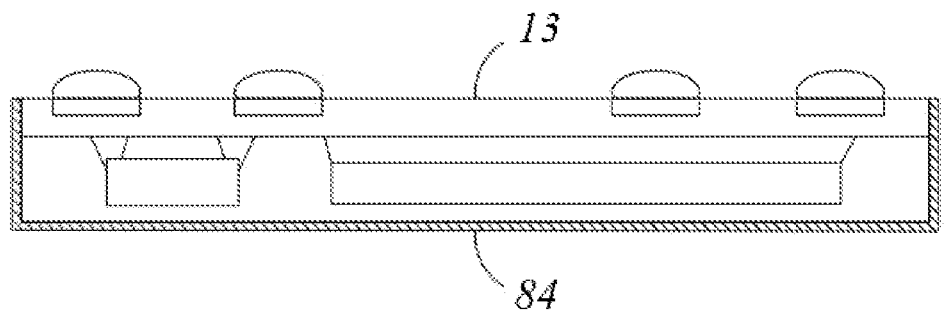
FIG. 9 is a schematic structural diagram of a third module and a fourth shielding layer according to Embodiment 3 of the present invention.

As shown in FIGS. 8 and 9, the second surface 22 of the main substrate is also provided with the third module 13, and the third module 13 and the second module 12 are located at least partially correspondingly, such that a plurality of package chips may be arranged at two sides of the main substrate 2, not limited to one side. Thus, the area and the size of the integrated packaged structure can be further reduced.

In this embodiment of the present invention, the second module 12 and the third module 13 are the SOC chip 12 and the memory module 13 respectively. The SOC chip stacked on the first surface 21 of the main substrate is also covered with the third shielding layer 83, and the memory module arranged on the second surface 22 of the main substrate is also covered with the fourth shielding layer 84.

In order to meet the multi-frequency and multi-bandwidth application of the integrated package structure, the first shielding layer 81, the second shielding layer 82, the third shielding layer 83 and the fourth shielding layer 84, that cover the first module, the main module, the SOC chip and the memory module, are unlimited in material and structure, which can be specifically selected according to the multi-frequency application and actual situations. Thus, the same or different materials or structures or various combinations can be adopted to achieve the best EMI effect and cost of the integrated package structure as a whole.

In addition, the positions of the SOC chip 12 and the memory module 13 may also be adjusted based on their own sizes, the actual space size in the integrated package structure, the specific process and the optimal cost, etc. Similarly, the positions of the first module 11 and the memory module 13 may also be adjusted based on factors such as their own sizes, the actual space size in the integrated package structure, the specific process and the optimal cost, etc.

Optionally, the second surface 22 of the main substrate may also be provided with connecting parts 9 for connecting the PCB below. The connecting parts 9 may be solder balls 9A or interposers 9B to electrically connect the main substrate 2 to the PCB. The connecting parts 9 may be horizontally arranged at two sides of the third module 13 to support the main substrate 2 and all package elements above the main substrate 2. Meanwhile, the second surface 22 of the main substrate may also be provided with a second plastic package layer of the main substrate, and this plastic package layer may at least encapsulate all side surfaces of the third module 13 and all side surfaces of the connecting parts 9.

Further, the main substrate 2 is an organic substrate, or a homogeneous or heterogeneous laminate of a wafer and a board-level redistribution layer using film coating or gluing.

Specifically, the main substrate 2 is unlimited in type, and may be an organic substrate formed by laminating a plurality of copper layers and resin, and then required circuit patterns may be acquired by drilling, electroless copper plating, copper electroplating, etching and the like. The main substrate 2 may also be a homogeneous or heterogeneous laminate, which consists of homogeneous or heterogeneous organic dielectric materials and metal circuits, and the circuits may be redistributed layer by layer to obtain the circuit patterns.

For the ease of understanding, examples will be described in detail below.

Embodiment 1

As shown in FIGS. 1-6, in the integrated package structure in this embodiment, the main substrate 2 includes the first surface 21 of the main substrate and the second surface 22 of the main substrate opposite to each other.

The second module 12 nested with the frame-shaped interposer 16, and the first module 11 are stacked, and the cavity element 14 and the large-size device 15 are horizontally arranged at two sides of the first module 11 and the second module 12 that are stacked.

The first shielding layer 81 covers the first module 11, and the second shielding layer 82 covers the main substrate 2 and all the package elements on the main substrate 2. Meanwhile, the second shielding layer 82 is electrically connected to the ground terminal of the main substrate 2, and the first shielding layer 81 is also electrically connected to the ground terminal of the main substrate 2 by the interposer 16.

The plastic package layer 4 covers the first surface 21 of the main substrate and encapsulates all the package elements on the first surface 21 of the main substrate. The first surface 41 of the plastic package layer is provided with the opening groove 6 at least partially facing the cavity element 14.

The large-size device 15 is a large-value inductor device, the cavity element 14 is a filter element, the second module 12 is an SOC chip, and two or more package elements are disposed in the first module 11.

Embodiment 2

As shown in FIG. 7, the integrated package structure in this embodiment is different from that in Embodiment 1 in that the opening grooves 6 are stepped opening grooves located at two convex corners of the plastic package layer 4. That is, the two stepped opening grooves 6 may be formed by cutting the two convex corners of the plastic package layer 4.

The upper surface of the cavity element 14 is the primary package surface. The stepped opening groove 6 proximal to the cavity element 14 is located above the primary package surface. The step surface is higher than the upper surface of the cavity element 14, so as to reduce a plastic package material above the primary package surface of the cavity element 14 and reduce the stress effect of the plastic package layer on the cavity element 14 under the action of thermal expansion and contraction.

In addition, the stepped opening groove 6 is also formed proximal to the large-size device 15 and located outside the large-size device 15, and the step surface is lower than the upper surface of the large-size device 15, so as to reduce the plastic package material outside the large-size device 15 and reduce the impact of stress.

Embodiment 3

As shown in FIGS. 8 and 9, the integrated package structure in this embodiment is different from that in Embodiment 1 in that the second surface 22 of the main substrate is also provided with the third module 13 located at least partially corresponding to the second module 12, the connecting parts 9 for connecting the PCB below are horizontally arranged at two sides of the third module 13. Meanwhile, no opening groove 6 is provided on the first surface 41 of the plastic package layer.

The connecting parts 9 are solder balls 9A, and the third module 13 is a memory chip.

Meanwhile, the second surface 22 of the main substrate may also be provided with a second plastic package layer (not shown in the figure) of the main substrate, and this plastic package layer may at least encapsulate all side surfaces of the third module 13 and all side surfaces of the connecting parts 9.

Embodiment 4

Figure 10:
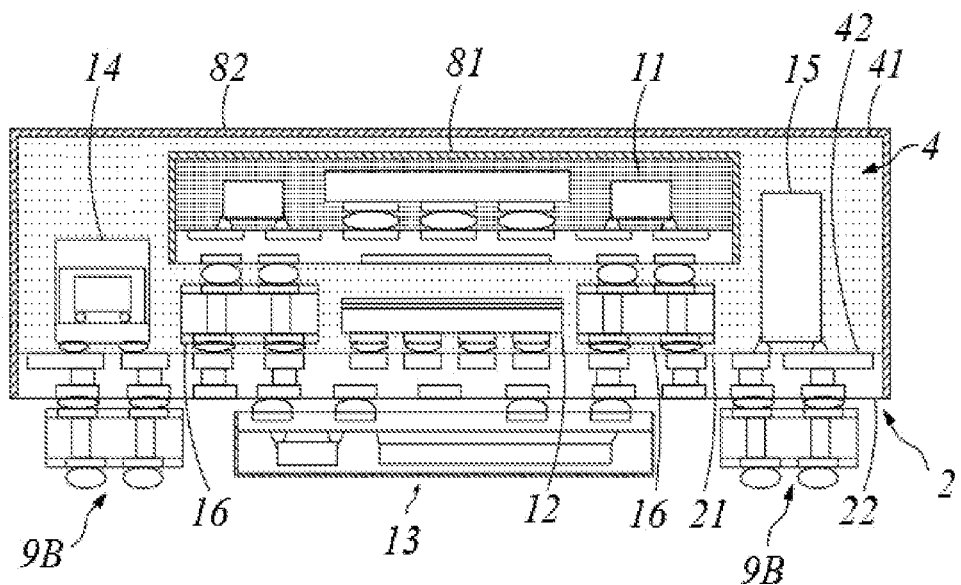
FIG. 10 is a schematic diagram of an integrated package structure according to Embodiment 4 of the present invention.

As shown in FIG. 10, the integrated package structure in this embodiment is different from that in Embodiment 3 in that the connecting parts 9 are interposers 9B.

In summary, in the integrated package structure provided by the present invention, the main substrate 2 includes the first surface 21 of the main substrate and the second surface 22 of the main substrate opposite to each other. The first module 11 and the second module 12 which are stacked, the cavity element 14 and the large-size device 15 are horizontally arranged on the first surface 21 of the main substrate. Therefore, by reasonable stacking and horizontal arrangement, the integrated package structure is more compact in overall space and more integrated in internal structure.

It should be understood that although the present invention is described in terms of embodiments in this description, not every embodiment includes only one independent technical solution. The statement mode of the description is merely for clarity, and those skilled in the art should regard the description as a whole. The technical solutions in various embodiments may also be combined properly to develop other embodiments that can be understood by those skilled in the art.

The series of detailed illustration listed above are merely for specifically illustrating the feasible embodiments of the present invention, but not intended to limit the protection scope of the present invention. Any equivalent embodiments or variations made without departing from the technical spirit of the present invention shall fall within the protection scope of the present invention.

What is claimed is:

1. An integrated package structure, comprising:
a main substrate;
a first module;
a second module;
a cavity element;
a large-size device; and
a plastic package layer covering a first surface of the main substrate and encapsulating the first module, the second module, the cavity element and the large-size device;
wherein the main substrate comprises the first surface of the main substrate and a second surface of the main substrate opposite to each other; the first module and the second module are stacked; and the first module and the second module which are stacked, the cavity element and the large-size device are horizontally arranged on the first surface of the main substrate, and are respectively electrically connected to the main substrate;
wherein the plastic package layer comprises a first surface of the plastic package layer distal from the main substrate and a second surface of the plastic package layer proximal to the main substrate; and the first surface of the plastic package layer is provided with an opening groove extending towards the cavity element and at least partially facing the cavity element.

2. The integrated package structure according to claim 1, wherein the opening groove is an inverted trapezoidal opening groove symmetrically distributed along a central axis of the cavity element.

3. The integrated package structure according to claim 1, wherein the opening groove is a stepped opening groove located at a convex corner of the plastic package layer.

4. The integrated package structure according to claim 1, further comprising a first shielding layer and a second shielding layer, wherein the first shielding layer covers the first module, and the second shielding layer covers the first module, the second module, the cavity element, the large-size device and the main substrate; and
the first shielding layer and the second shielding layer are different in material, or in structure, or in material and structure.

5. The integrated package structure according to claim 4, further comprising a hollow interposer, wherein the interposer is stacked between the first module and the main substrate, and electrically connects the first module to the main substrate; and the second module is located at a hollow portion of the interposer.

6. The integrated package structure according to claim 5, wherein one end of the interposer is electrically connected to the first shielding layer and the other end of the interposer is electrically connected to a ground terminal of the main substrate.

7. The integrated package structure according to claim 5, wherein the interposer is an organic substrate interposer, or an encapsulation interposer, or a redistributed heterogeneous laminated interposer.

8. The integrated package structure according to claim 1, further comprising a third module disposed on the second surface of the main substrate, wherein the third module at least partially faces the second module.

9. The integrated package structure according to claim 8, wherein the second module is an SOC chip, the third module is a memory module, and the integrated package structure further comprises a third shielding layer covering the SOC chip and a fourth shielding layer covering the memory module.

10. The integrated package structure according to claim 1, wherein the main substrate is an organic substrate, or a homogeneous or heterogeneous laminate of a wafer and a board-level redistribution layer using film coating or gluing.

11. An integrated package structure, comprising:
a main substrate;
a first module;
a second module;
a cavity element;
a large-size device;
a first shielding layer; and
a second shielding layer;
wherein the main substrate comprises a first surface of the main substrate and a second surface of the main substrate opposite to each other; the first module and the second module are stacked; and the first module and the second module which are stacked, the cavity element and the large-size device are horizontally arranged on the first surface of the main substrate, and are respectively electrically connected to the main substrate;
wherein the first shielding layer covers the first module, and the second shielding layer covers the first module, the second module, the cavity element, the large-size device and the main substrate; and the first shielding layer and the second shielding layer are different in material, or in structure, or in material and structure.

12. The integrated package structure according to claim 11, further comprising a hollow interposer, wherein the interposer is stacked between the first module and the main substrate, and electrically connects the first module to the main substrate; and the second module is located at a hollow portion of the interposer.

13. The integrated package structure according to claim 12, wherein one end of the interposer is electrically connected to the first shielding layer and the other end of the interposer is electrically connected to a ground terminal of the main substrate.

14. The integrated package structure according to claim 12, wherein the interposer is an organic substrate interposer, or an encapsulation interposer, or a redistributed heterogeneous laminated interposer.

* * * * *